US010943986B2

(12) United States Patent
Ramaswamy et al.

(10) Patent No.: US 10,943,986 B2
(45) Date of Patent: Mar. 9, 2021

(54) TRANSISTORS, MEMORY CELLS AND SEMICONDUCTOR CONSTRUCTIONS COMPRISING FERROELECTRIC GATE DIELECTRIC

(71) Applicant: Micron Technology, Inc., Boise, ID (US)

(72) Inventors: Durai Vishak Ramaswamy, Boise, ID (US); Kirk D. Prall, Boise, ID (US); Wayne Kinney, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/859,122

(22) Filed: Dec. 29, 2017

(65) Prior Publication Data

US 2018/0122917 A1    May 3, 2018

Related U.S. Application Data

(60) Continuation of application No. 15/411,886, filed on Jan. 20, 2017, now Pat. No. 9,882,016, which is a (Continued)

(51) Int. Cl.
*H01L 29/66* (2006.01)
*H01L 29/51* (2006.01)
(Continued)

(52) U.S. Cl.
CPC ........ *H01L 29/516* (2013.01); *G11C 14/0027* (2013.01); *H01L 27/10823* (2013.01);
(Continued)

(58) Field of Classification Search
CPC ............... H01L 29/516; H01L 29/6684; H01L 29/78391; H01L 21/28291;
(Continued)

(56) References Cited

U.S. PATENT DOCUMENTS

| 4,243,997 A | 1/1981 | Natori |
| 4,920,397 A | 4/1990 | Ishijima |

(Continued)

FOREIGN PATENT DOCUMENTS

| CN | 1675770 | 9/2005 |
| CN | 201380059900.7 | 11/2011 |

(Continued)

*Primary Examiner* — Ismail A Muse
(74) *Attorney, Agent, or Firm* — Wells St. John P.S.

(57) ABSTRACT

Some embodiments include a semiconductor construction having a gate extending into a semiconductor base. Conductively-doped source and drain regions are within the base adjacent the gate. A gate dielectric has a first segment between the source region and the gate, a second segment between the drain region and the gate, and a third segment between the first and second segments. At least a portion of the gate dielectric comprises ferroelectric material. In some embodiments the ferroelectric material is within each of the first, second and third segments. In some embodiments, the ferroelectric material is within the first segment or the third segment. In some embodiments, a transistor has a gate, a source region and a drain region; and has a channel region between the source and drain regions. The transistor has a gate dielectric which contains ferroelectric material between the source region and the gate.

17 Claims, 5 Drawing Sheets

Related U.S. Application Data continuation of application No. 14/991,792, filed on Jan. 8, 2016, now Pat. No. 9,590,066, which is a continuation of application No. 14/331,026, filed on Jul. 14, 2014, now Pat. No. 9,263,672, which is a division of application No. 13/682,190, filed on Nov. 20, 2012, now Pat. No. 8,796,751.

(51) Int. Cl.
| | | |
|---|---|---|
| H01L 21/28 | (2006.01) | |
| H01L 29/423 | (2006.01) | |
| H01L 29/78 | (2006.01) | |
| H01L 45/00 | (2006.01) | |
| G11C 14/00 | (2006.01) | |
| H01L 27/108 | (2006.01) | |
| H01L 27/1159 | (2017.01) | |
| H01L 29/08 | (2006.01) | |
| H01L 29/10 | (2006.01) | |
| H01L 29/40 | (2006.01) | |
| H01L 27/11585 | (2017.01) | |

(52) U.S. Cl.
CPC ...... *H01L 27/1159* (2013.01); *H01L 29/0847* (2013.01); *H01L 29/1037* (2013.01); *H01L 29/408* (2013.01); *H01L 29/40111* (2019.08); *H01L 29/4236* (2013.01); *H01L 29/42364* (2013.01); *H01L 29/42368* (2013.01); *H01L 29/511* (2013.01); *H01L 29/513* (2013.01); *H01L 29/518* (2013.01); *H01L 29/6684* (2013.01); *H01L 29/78391* (2014.09); *H01L 45/1206* (2013.01); *H01L 45/1233* (2013.01); *H01L 45/14* (2013.01); *H01L 27/10876* (2013.01); *H01L 27/11585* (2013.01)

(58) Field of Classification Search
CPC .............. H01L 27/11585; H01L 29/511; H01L 29/4236; H01L 27/10823; H01L 27/10876; H01L 29/7825; H01L 29/66613; H01L 29/66621; H01L 29/517; H01L 29/518; H01L 21/02175–02194
See application file for complete search history.

(56) References Cited

U.S. PATENT DOCUMENTS

| | | | |
|---|---|---|---|
| 5,225,363 A | 7/1993 | Riemenschneider | |
| 5,270,231 A | 12/1993 | Sameshima | |
| 5,327,374 A | 7/1994 | Krautschneider | |
| 5,471,417 A | 11/1995 | Krautschneider | |
| 5,589,814 A | 12/1996 | Xiang et al. | |
| 5,757,042 A | 5/1998 | Evans, Jr. et al. | |
| 6,066,880 A | 5/2000 | Kusunoki | |
| 6,069,381 A | 5/2000 | Black et al. | |
| 6,075,270 A | 6/2000 | Okihara et al. | |
| 6,159,782 A | 12/2000 | Xiang et al. | |
| 6,197,600 B1 | 3/2001 | Kijima et al. | |
| 6,278,164 B1 | 8/2001 | Hieda et al. | |
| 6,278,165 B1 | 8/2001 | Oowaki et al. | |
| 6,285,577 B1 | 9/2001 | Nakamura | |
| 6,313,033 B1 | 11/2001 | Chiang | |
| 6,323,525 B1 | 11/2001 | Noguchi et al. | |
| 6,323,580 B1 * | 11/2001 | Bernstein | H01L 27/20 310/324 |
| 6,335,550 B1 | 1/2002 | Miyoshi et al. | |
| 6,376,313 B1 | 4/2002 | Goebel | |
| 6,452,229 B1 * | 9/2002 | Krivokapic | H01L 29/42384 257/330 |
| 6,492,676 B2 | 12/2002 | Kusunoki | |
| 6,509,234 B1 * | 1/2003 | Krivokapic | H01L 29/42384 257/E21.415 |
| 6,555,872 B1 | 4/2003 | Dennen | |
| 6,664,592 B2 | 12/2003 | Inumiya et al. | |
| 6,690,047 B2 | 2/2004 | Oowaki et al. | |
| 6,815,297 B1 * | 11/2004 | Krivokapic | H01L 29/4908 257/213 |
| 6,963,100 B2 | 11/2005 | Kusunoki | |
| 6,979,846 B2 | 12/2005 | Yagishita et al. | |
| 7,050,330 B2 | 5/2006 | Forbes | |
| 7,132,300 B2 | 11/2006 | Tatsunari et al. | |
| 7,220,634 B2 | 5/2007 | Prall et al. | |
| 7,238,599 B2 | 7/2007 | Forbes | |
| 7,241,691 B2 | 7/2007 | Yong et al. | |
| 7,269,071 B2 | 9/2007 | Prall et al. | |
| 7,269,072 B2 | 9/2007 | Prall et al. | |
| 7,301,804 B2 | 11/2007 | Prall et al. | |
| 7,303,965 B2 | 12/2007 | Oowaki et al. | |
| 7,371,642 B2 | 5/2008 | Prall et al. | |
| 7,535,048 B2 | 5/2009 | Prall et al. | |
| 7,541,242 B2 | 6/2009 | Prall et al. | |
| 7,750,389 B2 | 7/2010 | Prall et al. | |
| 7,911,028 B2 * | 3/2011 | Lin | H01L 29/66181 257/532 |
| 7,960,779 B2 | 6/2011 | Toba et al. | |
| 8,097,911 B2 | 1/2012 | Keller | |
| 8,173,506 B2 | 5/2012 | Jung et al. | |
| 8,338,887 B2 | 12/2012 | Lindsay et al. | |
| 8,441,056 B2 | 5/2013 | Prall et al. | |
| 8,462,249 B2 | 6/2013 | Shinohara | |
| 8,610,191 B2 | 12/2013 | Moon et al. | |
| 8,829,583 B2 | 9/2014 | Taketani | |
| 8,987,799 B2 | 3/2015 | Taketani | |
| 9,305,926 B2 | 4/2016 | Taketani | |
| 10,283,184 B2 * | 5/2019 | Kim | H01L 29/78391 |
| 10,515,698 B2 * | 12/2019 | Kim | H01L 27/1159 |
| 2002/0038402 A1 | 3/2002 | Kanaya | |
| 2002/0061604 A1 | 5/2002 | Sitaram et al. | |
| 2002/0153572 A1 | 10/2002 | Kusunoki | |
| 2003/0034520 A1 | 2/2003 | Kusunoki | |
| 2003/0107088 A1 | 6/2003 | Inumiya et al. | |
| 2003/0235076 A1 | 12/2003 | Forbes | |
| 2004/0041176 A1 | 3/2004 | Prall | |
| 2004/0041214 A1 | 3/2004 | Prall | |
| 2004/0042290 A1 | 3/2004 | Tarui | |
| 2004/0057274 A1 | 3/2004 | Dimmler et al. | |
| 2004/0099922 A1 * | 5/2004 | Yamaguchi | H01L 27/088 257/500 |
| 2004/0130934 A1 | 7/2004 | Prall | |
| 2004/0227171 A1 | 11/2004 | Watanabe | |
| 2004/0229424 A1 | 11/2004 | Fischer | |
| 2005/0035398 A1 | 2/2005 | Williams et al. | |
| 2005/0054166 A1 | 3/2005 | Hsu et al. | |
| 2005/0059172 A1 | 3/2005 | Kim | |
| 2005/0087832 A1 * | 4/2005 | Park | H01L 21/76232 257/506 |
| 2005/0121709 A1 | 6/2005 | Ozaki | |
| 2005/0128804 A1 | 6/2005 | Forbes | |
| 2006/0030110 A1 | 2/2006 | Kumura | |
| 2006/0043457 A1 * | 3/2006 | Baik | G11C 16/0475 257/314 |
| 2006/0091458 A1 | 5/2006 | Kim et al. | |
| 2006/0124967 A1 | 6/2006 | Prall et al. | |
| 2006/0124992 A1 | 6/2006 | Prall et al. | |
| 2006/0124998 A1 | 6/2006 | Prall et al. | |
| 2006/0126398 A1 | 6/2006 | Prall et al. | |
| 2006/0128103 A1 | 6/2006 | Prall et al. | |
| 2006/0128104 A1 | 6/2006 | Prall et al. | |
| 2006/0152978 A1 | 7/2006 | Forbes | |
| 2006/0166443 A1 | 7/2006 | Forbes | |
| 2006/0216934 A1 | 9/2006 | Yong et al. | |
| 2006/0263946 A1 * | 11/2006 | Kreipl | H01L 27/11206 438/131 |
| 2007/0007571 A1 | 1/2007 | Lindsay et al. | |
| 2007/0015325 A1 * | 1/2007 | Goldbach | H01L 21/82385 438/199 |
| 2007/0045689 A1 | 3/2007 | Lim et al. | |
| 2007/0048941 A1 * | 3/2007 | Tang | H01L 29/42392 438/259 |
| 2007/0082454 A1 | 4/2007 | Stommer et al. | |

(56) References Cited

U.S. PATENT DOCUMENTS

| | | | |
|---|---|---|---|
| 2007/0090467 A1* | 4/2007 | Zhu | H01L 27/1207 257/390 |
| 2007/0120182 A1 | 5/2007 | Rouh et al. | |
| 2007/0166920 A1* | 7/2007 | Tang | H01L 29/42392 438/259 |
| 2007/0187774 A1* | 8/2007 | Goldbach | H01L 21/82385 257/369 |
| 2007/0200183 A1 | 8/2007 | Rueb | |
| 2007/0228432 A1 | 10/2007 | Ishihara | |
| 2007/0272960 A1 | 11/2007 | Hsu et al. | |
| 2008/0054407 A1* | 3/2008 | Ko | H01L 29/1008 257/565 |
| 2008/0079046 A1 | 4/2008 | Ozaki | |
| 2008/0157212 A1 | 7/2008 | Lavoie et al. | |
| 2008/0203443 A1 | 8/2008 | Wilson et al. | |
| 2008/0246366 A1* | 10/2008 | Burgener | H02N 11/002 310/300 |
| 2009/0010075 A9 | 1/2009 | Prall et al. | |
| 2009/0072303 A9 | 3/2009 | Prall et al. | |
| 2009/0242953 A1* | 10/2009 | Booth, Jr. | H01L 27/0629 257/301 |
| 2009/0261395 A1 | 10/2009 | Boescke | |
| 2010/0006928 A1* | 1/2010 | Pan | H01L 29/407 257/330 |
| 2010/0025815 A1* | 2/2010 | Lin | H01L 29/66181 257/532 |
| 2010/0041196 A1* | 2/2010 | Rouh | H01L 29/1041 438/270 |
| 2010/0041223 A1 | 2/2010 | Chen et al. | |
| 2010/0052067 A1 | 3/2010 | Hsu et al. | |
| 2010/0110753 A1* | 5/2010 | Slesazeck | H01L 27/11592 365/145 |
| 2010/0240184 A1* | 9/2010 | Jung | H01L 29/4236 438/270 |
| 2010/0244117 A1 | 9/2010 | Prall et al. | |
| 2011/0049593 A1* | 3/2011 | Schulze | H01L 29/517 257/295 |
| 2011/0092062 A1* | 4/2011 | Tang | H01L 29/42392 438/589 |
| 2011/0169066 A1 | 7/2011 | Moon et al. | |
| 2011/0187911 A1 | 8/2011 | Shinohara | |
| 2011/0297927 A1 | 12/2011 | Ramaswamy et al. | |
| 2012/0028425 A1 | 2/2012 | Lu et al. | |
| 2012/0033478 A1 | 2/2012 | Kang | |
| 2012/0061749 A1* | 3/2012 | Sakai | H01L 21/28017 257/330 |
| 2012/0161153 A1* | 6/2012 | Yumoto | H01L 29/4236 257/76 |
| 2012/0211813 A1 | 8/2012 | Taketani | |
| 2012/0261744 A1* | 10/2012 | Wang | H01L 29/0847 257/329 |
| 2013/0049090 A1 | 2/2013 | Lindsay et al. | |
| 2013/0059424 A1 | 3/2013 | Lindsay et al. | |
| 2013/0154021 A1 | 6/2013 | Chuang et al. | |
| 2013/0292698 A1* | 11/2013 | Then | H01L 29/7787 257/76 |
| 2014/0084343 A1* | 3/2014 | Dewey | H01L 29/0673 257/192 |
| 2014/0346595 A1 | 11/2014 | Taketani | |
| 2015/0171089 A1 | 6/2015 | Taketani | |

FOREIGN PATENT DOCUMENTS

| | | |
|---|---|---|
| CN | 201810003717 | 6/2020 |
| DE | 10008580 | 9/2000 |
| EP | 1089341 | 4/2001 |
| EP | 13856981 | 5/2016 |
| EP | 13856981 | 7/2016 |
| EP | 19215638 | 4/2020 |
| JP | H05-175509 | 7/1993 |
| JP | H06-104447 | 4/1994 |
| JP | H07-099310 | 4/1995 |
| JP | H09-055495 | 2/1997 |
| JP | H10-189966 | 7/1998 |
| JP | H11-040683 | 2/1999 |
| JP | H11-068104 | 3/1999 |
| JP | H11-068105 | 3/1999 |
| JP | 2000-012708 | 1/2000 |
| JP | 2000-058684 | 2/2000 |
| JP | 2000-252372 | 9/2000 |
| JP | 2002-203958 | 7/2002 |
| JP | 2004-079659 | 3/2004 |
| JP | 2007-005510 | 1/2007 |
| JP | 2007-043166 | 2/2007 |
| JP | 2007-110125 | 4/2007 |
| JP | 2008-027955 | 2/2008 |
| JP | 2008-535246 | 8/2008 |
| JP | 2012-174866 | 9/2012 |
| JP | 2000-082814 | 4/2020 |
| KR | 2002-0015761 | 3/2002 |
| KR | 10-0680978 | 2/2007 |
| KR | 10-2009-0009561 | 1/2009 |
| TW | 102138953 | 5/2015 |
| WO | WO 2006/104585 | 10/2006 |
| WO | PCT/US2013/065102 | 1/2014 |
| WO | PCT/US2013/065102 | 6/2015 |

\* cited by examiner

TRANSISTORS, MEMORY CELLS AND SEMICONDUCTOR CONSTRUCTIONS COMPRISING FERROELECTRIC GATE DIELECTRIC

RELATED PATENT DATA

This patent resulted from a continuation of U.S. patent application Ser. No. 15/411,886 which was filed Jan. 20, 2017, which is hereby incorporated herein by reference; which is a continuation of U.S. patent application Ser. No. 14/991,792, which was filed Jan. 8, 2016, and which is hereby incorporated herein by reference; which resulted from a continuation of U.S. patent application Ser. No. 14/331,026, which was filed Jul. 14, 2014, which issued as U.S. Pat. No. 9,263,672, and which is hereby incorporated herein by reference; which resulted from a divisional of U.S. patent application Ser. No. 13/682,190, which was filed Nov. 20, 2012, which issued as U.S. Pat. No. 8,796,751, and which is hereby incorporated herein by reference.

TECHNICAL FIELD

Transistors, memory cells and semiconductor constructions.

BACKGROUND

Memory is one type of integrated circuitry, and is used in computer systems for storing data. Integrated memory is usually fabricated in one or more arrays of individual memory cells. The memory cells may be volatile, semi-volatile, or nonvolatile. Nonvolatile memory cells can store data for extended periods of time, and in some instances can store data in the absence of power. Volatile memory dissipates and is therefore refreshed/rewritten to maintain data storage.

The memory cells are configured to retain or store information in at least two different selectable states. In a binary system, the states are considered as either a "0" or a "1". In other systems, at least some individual memory cells may be configured to store more than two selectable states of information.

Dynamic random access memory (DRAM) is one type of memory, and is utilized in numerous electronic systems. A DRAM cell may comprise a transistor in combination with a charge storage device (for instance, a capacitor). DRAM has an advantage of having rapid read/write; but has disadvantages of being highly volatile (often requiring refresh of several hundreds of times per second) and of being erased in the event of power loss.

It is desired to develop improved memory devices.

DETAILED DESCRIPTION OF THE ILLUSTRATED EMBODIMENTS

Some embodiments include transistors which comprise ferroelectric material incorporated into gate dielectric. In some embodiments, such transistors may be incorporated into memory cells. Example embodiments are described with reference to FIGS. 1-8.

Figure 1:
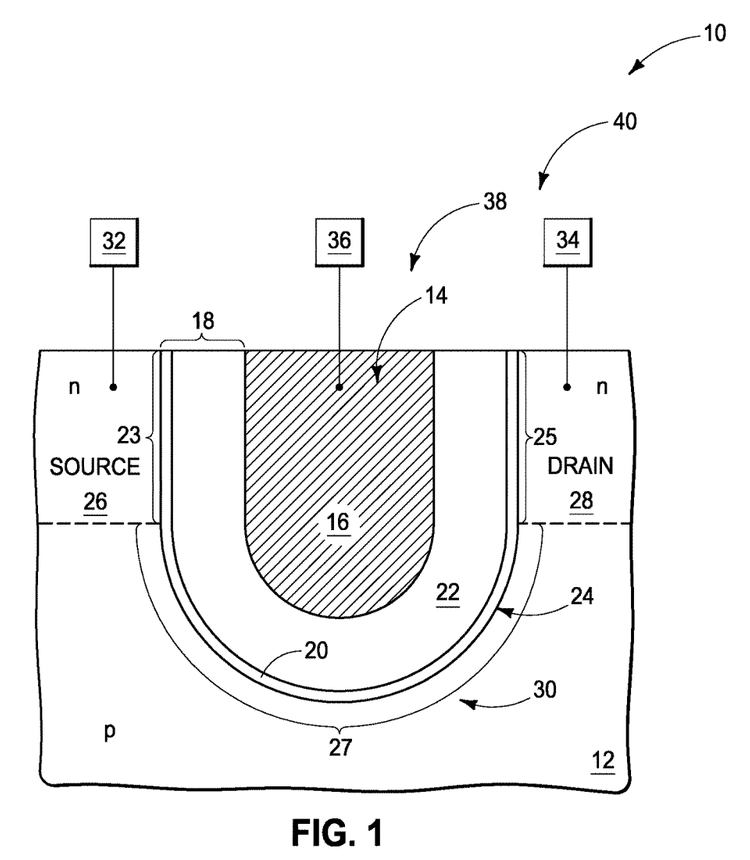
FIG. 1 is a diagrammatic cross-sectional view of a portion of a semiconductor construction illustrating an example embodiment transistor incorporated into an example embodiment memory cell.

Referring to FIG. 1, an example embodiment memory cell 40 is illustrated as part of a semiconductor construction 10.

The construction 10 includes a base 12. The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

A transistor gate 14 extends into base 12. The transistor gate comprises gate material 16. Such gate material may be any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some example embodiments, the gate material 16 may comprise, consist essentially of, or consist of one or more of titanium nitride, titanium aluminum nitride, tungsten nitride, copper and tantalum nitride.

Gate dielectric 18 is between gate material 14 and base 12. The gate dielectric is configured as an upwardly-opening container 24 along the cross-section of FIG. 1, and the gate 14 is within such container. The gate dielectric comprises two separate materials 20 and 22 in the embodiment of FIG. 1, which may be referred to as a first material and a second material, respectively. The first material 20 forms an outer boundary of the container 24, and is directly against the semiconductor base 12. The second material 22 is between the first material 20 and the gate 14. In some embodiments, the first material 20 is a non-ferroelectric material, and the second material is a ferroelectric material. In such embodiments, the first material 20 may comprise, consist essentially of, or consist of one or both of silicon dioxide and silicon nitride; and the second material 22 may comprise, consist essentially of, or consist of one or more of yttrium-doped zirconium oxide, yttrium-doped hafnium oxide, magnesium-doped zirconium oxide, magnesium-doped hafnium oxide, silicon-doped hafnium oxide, silicon-doped zirconium oxide and barium-doped titanium oxide. Accordingly, in some embodiments the first material 20 may comprise one or more of silicon, nitrogen and oxygen; and the second material 22 may comprise one or more of Hf, Zr, Si, O, Y, Ba, Mg and Ti.

In some embodiments, the ferroelectric material 22 may have a thickness within a range of from about 10 angstroms to about 200 angstroms, and the non-ferroelectric material 20 may have a thickness within a range of from about 10 angstroms to about 20 angstroms.

Construction 10 comprises a conductively-doped source region 26 extending into base 12, and a conductively-doped drain region 28 extending into the base. Lower boundaries of the source and drain regions are diagrammatically illustrated with dashed lines. The source and drain regions are both adjacent to gate 14, and are spaced from the gate by the gate dielectric 18. The source and drain regions are spaced from one another by a channel region 30 that extends under the gate 14.

In some embodiments, the source region 26 may be referred to as a first region of the base adjacent to the gate 14, and the drain region 28 may be referred to as a second region of the base adjacent to the gate. Such first and second regions of the base are spaced from one another by an intervening region of the base comprising the channel region 30.

The gate dielectric 18 may be considered to comprise a first segment 23 between the source region 26 and the gate 14, a second segment 25 between the drain region 28 and the gate 14, and a third segment 27 between the first and second segments. In some embodiments, the segment 23 may be considered to correspond to a first substantially vertical leg of container 24, the segment 25 may be considered to correspond to a second substantially vertical leg of the container, and the segment 27 may be considered to comprise a bottom of the container.

In the shown embodiment, all of the first, second and third segments (23, 25 and 27) of gate dielectric 18 comprise ferroelectric material 22. In other embodiments (some of which are discussed below with reference to FIGS. 4-6), the ferroelectric material 22 may be omitted from one or more of such segments.

In some embodiments, the non-ferroelectric material 20 provides a barrier between ferroelectric material 22 and base 12 to avoid undesired diffusion of constituents between the ferroelectric material and the base and/or to avoid undesired reaction or other interaction between the ferroelectric material and the base. In such embodiments, the non-ferroelectric material 20 may be provided entirely along an outer edge of the gate dielectric (as shown) to form a boundary of the container 24 against the semiconductor base 12 (with source and drain regions 26 and 28 being considered to be part of the base). In some embodiments, diffusion and/or other interactions are not problematic relative to the ferroelectric material 22 even in the absence of at least some of the non-ferroelectric material, and accordingly some or all the non-ferroelectric material 20 may be omitted from one or more of the segments 23, 25 and 27.

In the shown embodiment, the non-ferroelectric material 20 is a substantially consistent thickness along an entirety of container 24. In other embodiments (one of which is discussed below with reference to FIG. 7), the non-ferroelectric material 20 may have a different thickness along one region of container 24 as compared to another region.

In the shown embodiment, source region 26 is electrically coupled to circuitry 32, drain region 28 is electrically coupled to circuitry 34, and gate 14 is electrically coupled to circuitry 36. A transistor 38 comprises the gate 14 together with the source/drain regions 26 and 28, and such transistor is incorporated into an integrated circuit through circuitry 32, 34 and 36.

Although the embodiment of FIG. 1 utilizes transistor 38 as part of a memory cell 40, in other embodiments the transistor 38 may be utilized in other applications. For instance, transistor 38 may be utilized in logic or other circuitry in place of a conventional transistor.

Figure 2:
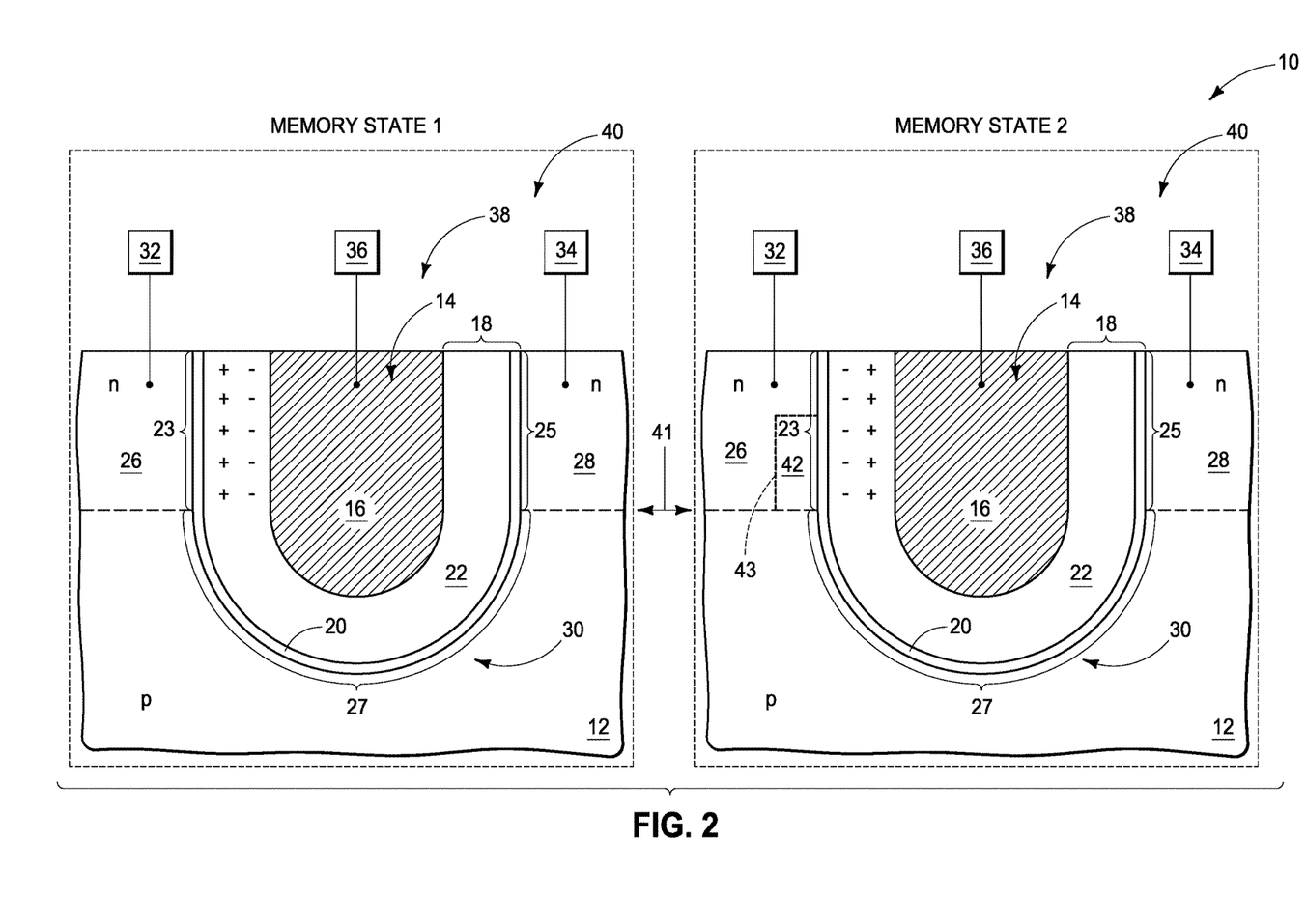
FIG. 2 diagrammatically illustrates the memory cell of FIG. 1 in two different example memory states.

The ferroelectric material 22 of gate dielectric 18 may be polarized into either of two stable orientations, which may enable two selectable states of memory cell 40. Example memory states are shown in FIG. 2, with the memory states being labeled as "MEMORY STATE 1" and "MEMORY STATE 2". The illustrated memory cell of FIG. 2 has n-type doped source and drain regions 26 and 28, and a p-type doped channel region. In other embodiments, the source and drain regions may be p-type doped and the channel region may be n-type doped.

MEMORY STATE 1 and MEMORY STATE 2 differ from one another relative to the orientation of charge within ferroelectric material 22. Such charge orientation is diagrammatically illustrated with "+" and "−" in the diagrammatic illustrations of FIG. 2. Specifically, the memory states of FIG. 2 are shown to differ from one another relative to charge polarization within ferroelectric material 22. A double-headed arrow 41 is provided in FIG. 2 to diagrammatically illustrate that the memory cell 40 may be reversibly transitioned between the shown memory states.

In the shown embodiment, the polarization change within ferroelectric material 22 specifically occurs within the region 23 between gate 14 and source region 26 (the polarization change may also occur in other regions, such as adjacent the channel in some embodiments; or may occur only in the region 23 as shown in FIG. 2). The MEMORY STATE 1 comprises a "+" component of the polarized ferroelectric material along the n-type doped source region 26, and the MEMORY STATE 2 comprises a "−" component of the polarized ferroelectric material along the n-type doped source region 26. The "−" component of the ferroelectric material is shown to induce a depletion region 42 within the n-type doped source region 26 (a boundary of the depletion region is diagrammatically illustrated with the dashed line 43). In the illustrated embodiment, the depletion region 42 is deep within the source region 26, and specifically is along a portion of the source region that interfaces with channel region 30. The transistor 38 may have an increased effective channel length relative to an analogous transistor lacking the depletion region, which may reduce short channel effects and thereby improve scalability of the memory cell for higher levels of integration.

In the shown embodiment, the non-ferroelectric material 20 is between ferroelectric material 22 and source region 26, and accordingly the depletion region 42 is spaced from the ferroelectric material 22 by a segment of non-ferroelectric material 20. In other embodiments, the non-ferroelectric material 20 may be omitted, and the depletion region 42 may directly contact the ferroelectric material 22.

The memory cell 40 of FIG. 2 may have advantages of being substantially nonvolatile, and of retaining stored information in the absence of power.

The memory cell 40 may be programmed with any suitable operation, and in some example embodiments may be programmed utilizing voltage differentials between gate 14 and source 26 of less than or equal to about 10 volts; in some example embodiments utilizing voltage differentials of less than or equal to about 5 volts; and in some example embodiments utilizing voltage differentials of from about 0.5 volts to about 5 volts.

The dopant concentrations utilized within source region 26 and drain region 28 may be any suitable dopant concentrations. In some embodiments, the drain region may be more heavily doped than at least some of the source region; and in some embodiments the entirety of the drain region may be more heavily doped than any portion of the source region. In some embodiments, relatively heavy doping of the drain region alleviates influence of ferroelectric polarization on operation of the drain side of transistor 38, while relatively light doping of at least some of the source region enables the influence of the ferroelectric polarization on the source side of the transistor to be enhanced relative to the influence that would occur with heavier doping of the source region. The terms "relatively heavy doping" and "relatively light doping" are utilized with reference to one another, and thus the term "relatively heavy doping" means doping heavier than the doping indicated by the term "relatively light doping".

In some embodiments the drain region 28 may be n-type doped, and some or all of the drain region may comprise a dopant concentration of at least about $1\times10^{20}$ atoms/centimeter$^3$; such as, for example, a dopant concentration within a range of from about $1\times10^{18}$ atoms/centimeter$^3$ to about $1\times10^{20}$ atoms/centimeter$^3$. In some embodiments the source region 26 may be n-type doped, and at least some of the source region may comprise a dopant concentration of less than about $1\times10^{20}$ atoms/centimeter$^3$; such as, for example, a dopant concentration within a range of from about $1\times10^{16}$ atoms/centimeter$^3$ to about $1\times10^{19.5}$ atoms/centimeter$^3$.

Figure 3:
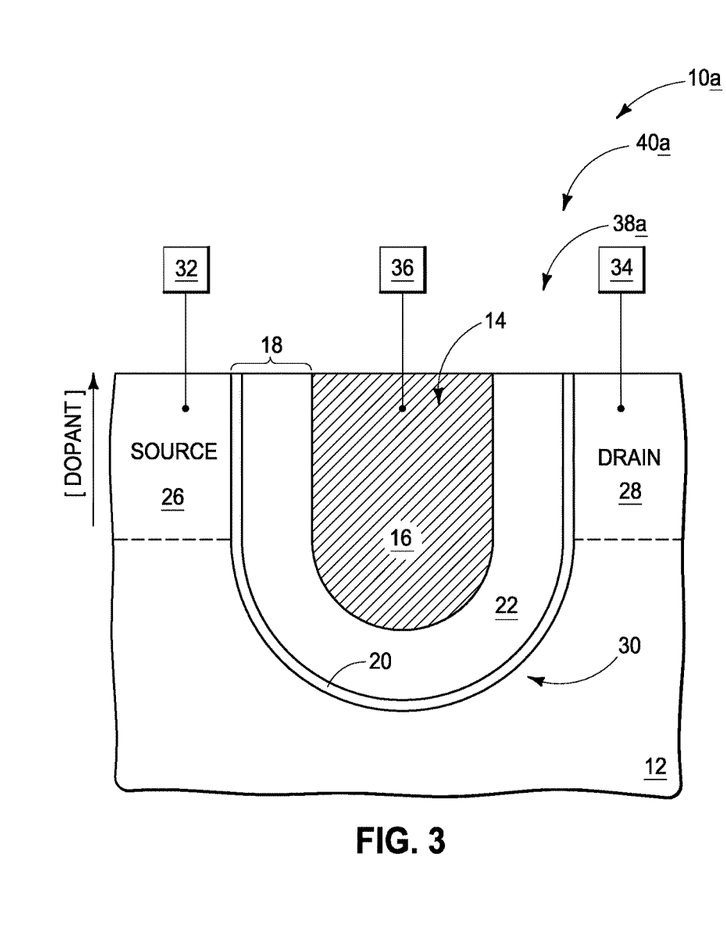
FIGS. 3-7 diagrammatically illustrate example embodiment transistors incorporated into example embodiment memory cells.

In some embodiments, the source region 26 may comprise a gradient of dopant concentration, with dopant concentration being lighter at deeper locations of the source region as compared to shallower locations of the source region. FIG. 3 shows a construction 10a illustrating an example embodiment memory cell 40a having decreasing dopant concentration with increasing depth in the source region, (the dopant concentration is illustrated as [DOPANT]). The construction of FIG. 3 advantageously may comprise the lighter dopant concentration within the source region at a location where the depletion region 42 forms during programming of a memory state analogous to the MEMORY STATE 2 of FIG. 2.

Figure 4:
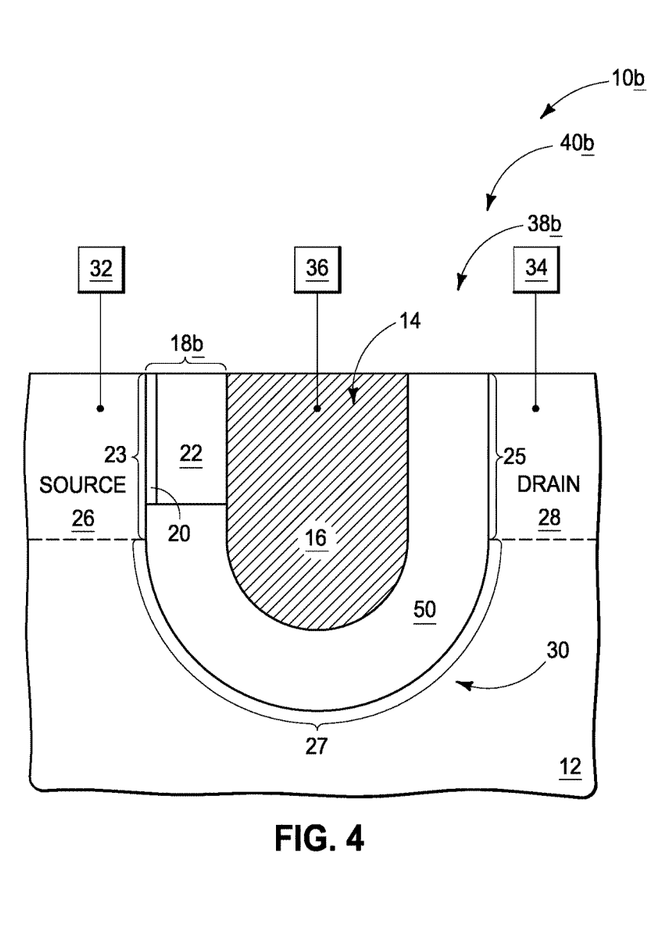

The example embodiment memory cell 40 shown in FIG. 1 comprises both ferroelectric material 22 and non-ferroelectric material 20 within all of the segments 23, 25 and 27 of dielectric material 18. FIG. 4 shows an alternative example embodiment memory cell 40b having ferroelectric material 22 only within segment 23.

The memory cell 40b is part of a construction 10b, and comprises a transistor 38b containing gate dielectric 18b. The gate dielectric 18b comprises the non-ferroelectric material 20 between ferroelectric material 22 and source region 26, and comprises additional non-ferroelectric material 50 throughout the segments 25 and 27 (i.e., the segments along drain region 28 and channel region 30). The non-ferroelectric material 50 may comprise any suitable composition or combination of compositions. In some embodiments, the non-ferroelectric material 50 may comprise a same composition as non-ferroelectric material 20, and in other embodiments may comprise a different composition than non-ferroelectric material 20. In some embodiments, non-ferroelectric material 50 may comprise, consist essentially of, or consist of one or both of second dioxide and second nitride.

Figure 5:
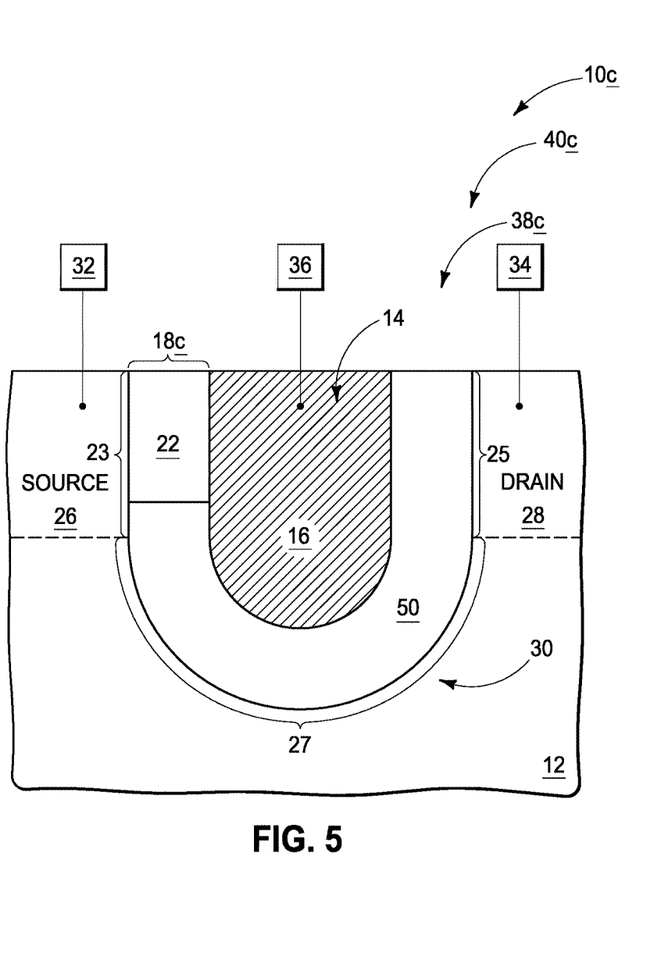

The memory cell 40b of FIG. 4, like the above-discussed embodiment of FIG. 1, comprises non-ferroelectric material entirely along an interface of the source region 26 and the gate dielectric, and entirely along an interface of the drain region 28 and the gate dielectric. FIG. 5 shows a memory cell analogous to that of FIG. 4, but in which an interface of the gate dielectric with the source region comprises ferroelectric material. Specifically, FIG. 5 shows a construction 10c comprising a memory cell 40c having a transistor 38c with gate dielectric 18c. The gate dielectric 18c comprises ferroelectric material 22 and non-ferroelectric material 50. The ferroelectric material 22 directly contacts both the source region 26 and the gate 14.

In the shown embodiment, a portion of the segment of the gate dielectric between the source region and the transistor gate (i.e., a portion of the segment 23 of the gate dielectric) consists of ferroelectric material, and the remainder of the gate dielectric (i.e., the remainder segment 23, together with segments 25 and 27) consists of non-ferroelectric material. In the shown embodiment, only a portion of an interface between the gate dielectric 18c and the source region 26 consists of ferroelectric material 22. In other embodiments, an entirety of the interface between the gate dielectric and the source region may consist of the ferroelectric material.

Figure 6:
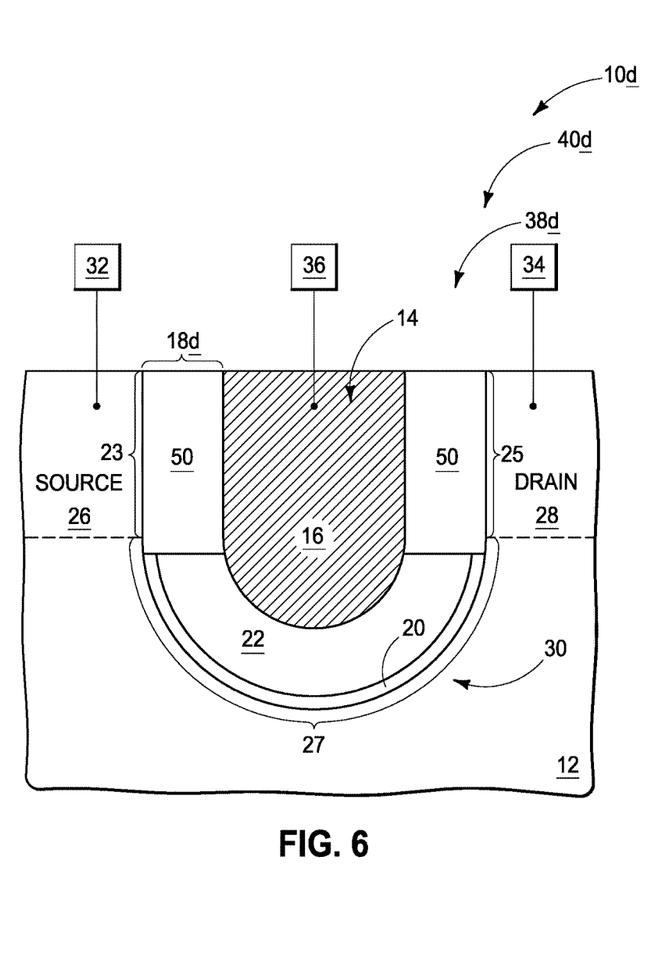

FIG. 6 shows a construction 10d illustrating another example embodiment memory cell 40d. The memory cell comprises a transistor 38d having gate dielectric 18d. The gate dielectric comprises non-ferroelectric material 50 throughout the entirety of the segment between the source region 26 and the gate 14 (i.e., the segment 23), and throughout the entirety of the segment between the drain region 28 and the gate 14 (i.e., the segment 25). The gate dielectric further comprises ferroelectric material 22 within at least some of the segment along the channel region 30 (i.e., the segment 27). Such may enable selective coupling of the ferroelectric material with the channel region, exclusive of coupling between the ferroelectric material and the source region and/or drain region, which may enable operational characteristics of the memory cell to be tailored for particular applications. Further, if transistor 38d is utilized in place of a conventional transistor in an integrated circuit application other than as a part of a memory cell, the selective coupling to the channel region may enable operational aspects of such transistor to be tailored for specific applications.

The embodiment of FIG. 6 shows the non-ferroelectric material 20 provided between ferroelectric material 22 and base 12. In other embodiments, the non-ferroelectric material 20 may be omitted so that ferroelectric material 22 directly contacts base 12.

Figure 7:
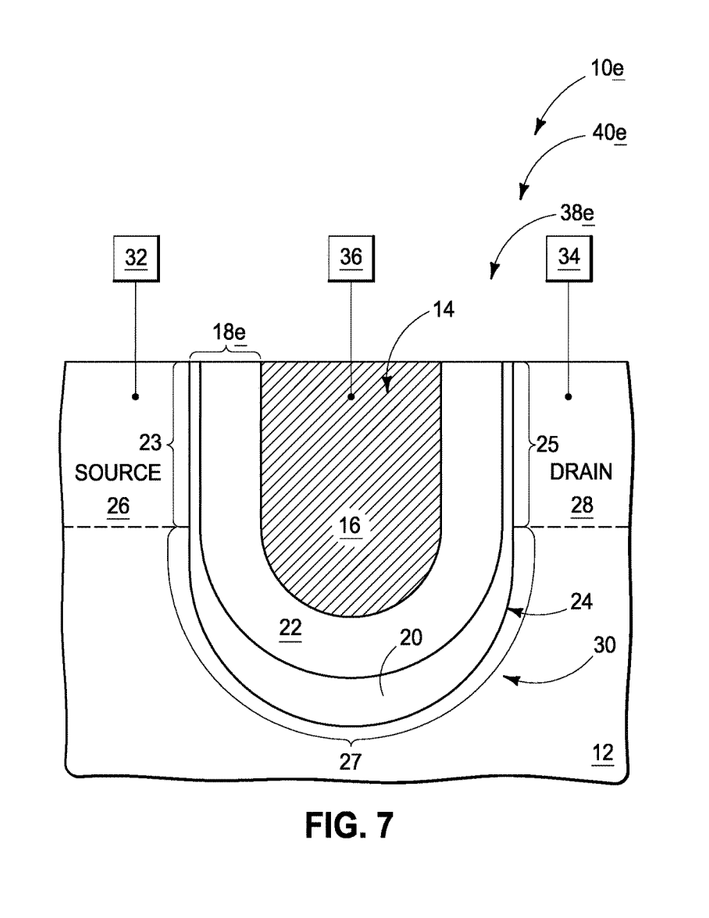

Another example embodiment memory cell 40e is shown in FIG. 7 as part of a construction 10e comprising a transistor 38e with gate dielectric 18e. The memory cell 40e of FIG. 7 is similar to the memory cell 40 of FIG. 1, in that the memory cell 40e comprises both the non-ferroelectric material 20 and the ferroelectric material 22 within all of the segments 23, 25 and 27 of the gate dielectric. However, unlike the embodiment of FIG. 1, that of FIG. 7 has the non-ferroelectric material 20 thicker within the segment 27 (i.e. along the bottom of the container 24 defined by the gate dielectric) than within the segments 23 and 25 (i.e., along the substantially vertical legs of the container 24 defined by the gate dielectric). Such can alleviate or eliminate coupling between the ferroelectric material 22 and the channel 30, which may be desired in some embodiments. In some embodiments, the non-ferroelectric material 20 may have a thickness within segments 23 and 25 within a range of from about 10 angstroms to about 20 angstroms, and may have a thickness along the bottom of container 24 within a range of from about 25 angstroms to about 50 angstroms.

Figure 8:
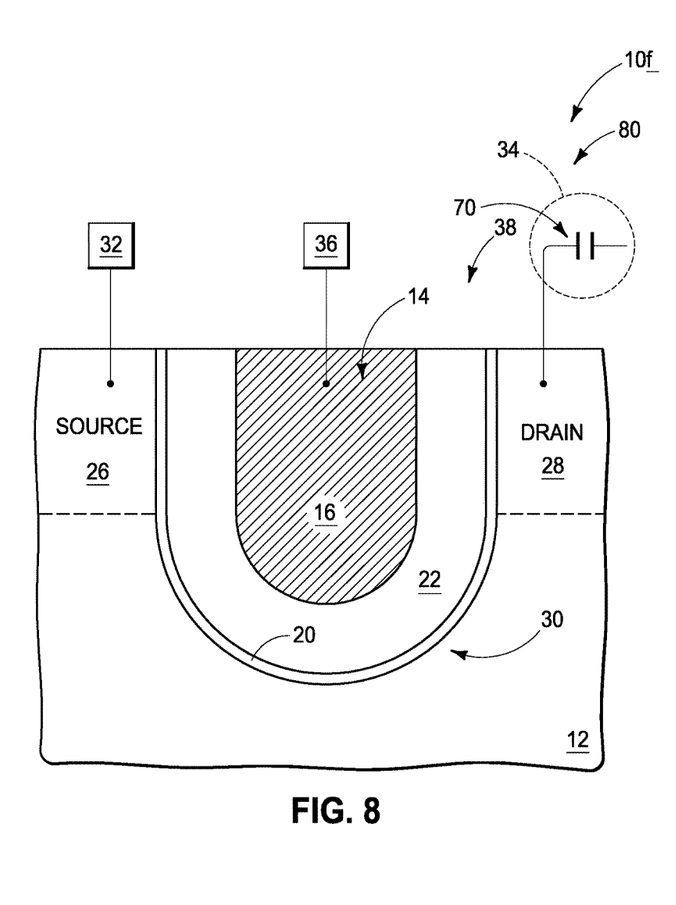
FIG. 8 illustrates another embodiment memory cell comprising the example embodiment transistor of FIG. 1.

In some embodiments, the memory cells described above may comprise DRAM-type cells. For instance, the circuitry 34 may correspond to a charge-storage device (such as, for example, a capacitor), the circuitry 32 may include an access/sense line (such as, for example, a bitline), and the circuitry 36 may include a wordline that extends in and out of the page relative to the cross-sections of FIGS. 1-7. FIG. 8 shows a construction 10*f* comprising the transistor 38 of FIG. 1 incorporated into a DRAM-type memory cell 80.

The DRAM-type cell of FIG. 8 may be, in a sense, considered to include both a volatile memory storage component (the capacitor 70, with such component storing data by utilizing different charge states of the capacitor as different memory states) and a nonvolatile memory storage component (the transistor 38, with such component storing data by utilizing different polarization orientations of ferroelectric material 22 as different memory states, as discussed above with reference to FIG. 2).

The volatile memory storage component may have rapid read/write characteristics analogous to those of a conventional DRAM, and the nonvolatile memory storage component may enable the cell to have capabilities beyond those of conventional DRAM. For instance, in some embodiments the cell may be configured so that the nonvolatile memory storage component backs up information from the volatile memory storage component so that the information is stable in the event of power failure. As another example, in some embodiments the cell may be configured so that the nonvolatile memory storage component is utilized for operations separate from those conducted by the volatile memory storage component and/or for operations that modify or overlap those of the volatile memory storage component. Such may enable a DRAM array comprising memory cells 80 of the type shown in FIG. 8 to perform operations that would otherwise comprise both logic and memory aspects of conventional integrated circuitry, which may enable a DRAM array comprising memory cells 40 of the type shown in FIG. 8 to be scaled to higher levels of integration than may be achieved with conventional DRAM circuitry.

The devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a semiconductor construction includes a semiconductor base and a gate extending into the base. A first region of the base adjacent the gate is a conductively-doped source region, and a second region of the base adjacent the gate and spaced from the first region is a conductively-doped drain region. A gate dielectric comprises a first segment between the source region and the gate, a second segment between the drain region and the gate, and a third segment between the first and second segments. At least a portion of the gate dielectric comprises ferroelectric material.

In some embodiments, a transistor comprises a gate, a source region, a drain region, and a channel region between the source and drain regions. The transistor also comprises a gate dielectric between the gate and the source, drain and channel regions. The gate dielectric comprises ferroelectric material between the source region and the gate.

In some embodiments, a semiconductor construction comprises a semiconductor base and a gate extending into the base. A region of the base on one side of the gate is a conductively-doped source region, and a region of the base on an opposing side of the gate relative to said one side is a conductively-doped drain region. The drain region is more heavily doped than the source region. The construction includes gate dielectric which comprises a first segment between the source region and the gate, a second segment between the drain region and the gate, and a third segment between the first and second segments. The gate dielectric, along a cross-section, is configured as an upwardly-opening container having the gate therein. The first segment of the gate dielectric comprises a first substantially vertical leg of the container. The second segment of the gate dielectric comprises a second substantially vertical leg of the container. The third segment of the gate dielectric comprises a bottom of the container. The gate dielectric comprises non-ferroelectric material directly against ferroelectric material, with the non-ferroelectric material being a boundary of the container directly against the semiconductor base. The non-ferroelectric material is thicker along the bottom of the container than along the first and second substantially vertical legs of the container.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   a semiconductor base having a recess extending into a conductively doped region of the semiconductor base through an upper surface, the conductively doped region being doped with a first-type dopant;
   a source region within the semiconductor base on a first side of the recess and a drain region within the semiconductor base on a second side of the recess, the source region and the drain region being majority conductively doped with a second-type dopant, the first-type and second-type dopants being opposite dopant types relative to each other;

a gate material comprising a metal material disposed within the recess between the source region and the drain region, the gate material having a top surface elevationally equivalent with the upper surface of the semiconductor base and a lower surface within the conductively doped region of the semiconductor base;

a non-ferroelectric dielectric material disposed between the source region and the gate material and between the drain region and the gate material, the non-ferroelectric dielectric material being in direct physical contact with the semiconductor base along the source region and the drain region within the recess; and a ferroelectric material between the non-ferroelectric dielectric material and the gate material along the source region and the drain region, the ferroelectric material being in direct physical contact with the metal material of the gate and comprising one or more materials selected from the group consisting of yttrium-doped zirconium oxide, yttrium-doped hafnium oxide, magnesium-doped hafnium oxide, magnesium-doped zirconium oxide, silicon-doped zirconium oxide, and silicon-doped hafnium oxide.

2. The semiconductor construction of claim 1 wherein the ferroelectric material is in direct physical contact with the non-ferroelectric dielectric material.

3. The semiconductor construction of claim 1 wherein the ferroelectric material is in direct physical contact with the gate material.

4. The semiconductor construction of claim 1 wherein the non-ferroelectric dielectric material comprises Si, O and N.

5. The semiconductor construction of claim 1 wherein the ferroelectric material comprises one or more of Hf, Zr, Si, O, Y, Ba, Mg and Ti.

6. The semiconductor construction of claim 1 wherein the ferroelectric material comprises hafnium oxide.

7. The semiconductor construction of claim 1 wherein the non-ferroelectric dielectric material lines an entirety of the semiconductor base within the recess, along a cross section.

8. The semiconductor construction of claim 7 wherein the non-ferroelectric dielectric material has an outer surface contacting the semiconductor base and an opposing inner surface, and wherein the ferroelectric material is present along an entirety of the inner surface along the cross section.

9. The semiconductor construction of claim 1 wherein an entirety of the gate material is within the recess and does not extend above the upper surface.

10. A transistor, comprising:

a recessed gate having an upper surface coplanar with an upper surface of a substrate, the recessed gate comprising a metal material;

a p-type doped source region;

a p-type doped drain region; and a gate dielectric between the recessed gate and the p-type doped source and drain regions; the gate dielectric comprising a non-ferroelectric material and a ferroelectric material between the p-type doped source region and the recessed gate, the ferroelectric material comprising one or more materials selected from the group consisting of yttrium-doped zirconium oxide, yttrium-doped hafnium oxide, magnesium-doped hafnium oxide, magnesium-doped zirconium oxide, silicon-doped zirconium oxide, and silicon-doped hafnium oxide, the recessed gate extending into an n-type doped region of the substrate and being in direct physical contact with the ferroelectric material.

11. The transistor of claim 10 wherein the gate dielectric further comprises the non-ferroelectric material and the ferroelectric material between the p-type doped drain region and the recessed gate.

12. The transistor of claim 10 wherein the ferroelectric material comprises one or more of Hf, Zr, Si, O, Y, Ba, Mg and Ti.

13. The transistor of claim 10 wherein the ferroelectric material comprises hafnium oxide.

14. The transistor of claim 10 wherein the non-ferroelectric material comprises Si, O and N.

15. The transistor of claim 10 wherein the recessed gate is disposed within a recess in a semiconductive material and wherein the gate dielectric lines an entirety of the recess along a cross section.

16. The transistor of claim 15 wherein the gate dielectric is in direct physical contact with the semiconductive material.

17. A transistor, comprising:

a recessed gate comprising a metal material having an upper surface coplanar with an upper surface of a substrate;

an n-type doped source region;

an n-type doped drain region; and a gate dielectric between the recessed n-type doped gate and the source and drain regions; the gate dielectric comprising a non-ferroelectric material and a ferroelectric material between the n-type doped source region and the recessed gate, the ferroelectric material comprising one or more materials selected from the group consisting of yttrium-dopes zirconium oxide, yttrium-doped hafnium oxide, magnesium-doped hafnium oxide, magensium-doped zirconium oxide, silicon-doped zirconium oxide, and silicon-doped hafnium oxide, the recessed gate extending into a p-type doped region of the substrate and being in direct physical contact with the ferroelectric material.

* * * * *